United States Patent
Matsuda et al.

(10) Patent No.: US 11,411,155 B2
(45) Date of Patent: Aug. 9, 2022

(54) THERMOELECTRIC CONVERSION MATERIAL, THERMOELECTRIC CONVERSION MODULE USING SAME, AND METHOD OF MANUFACTURING THERMOELECTRIC CONVERSION MATERIAL

(71) Applicant: HITACHI METALS, LTD., Tokyo (JP)

(72) Inventors: Michiko Matsuda, Tokyo (JP); Takeshi Shimada, Tokyo (JP); Yoshihiro Kamitani, Tokyo (JP)

(73) Assignee: HITACHI METALS, LTD., Tokyo (JP)

(*) Notice: Subject to any disclaimer, the term of this patent is extended or adjusted under 35 U.S.C. 154(b) by 0 days.

(21) Appl. No.: 17/262,041

(22) PCT Filed: Sep. 25, 2019

(86) PCT No.: PCT/JP2019/037494
§ 371 (c)(1),
(2) Date: Jan. 21, 2021

(87) PCT Pub. No.: WO2020/067111
PCT Pub. Date: Apr. 2, 2020

(65) Prior Publication Data
US 2021/0257530 A1    Aug. 19, 2021

(30) Foreign Application Priority Data
Sep. 26, 2018 (JP) .............................. JP2018-180925

(51) Int. Cl.
*H01L 35/18* (2006.01)
*H01L 35/08* (2006.01)
(Continued)

(52) U.S. Cl.
CPC .............. *H01L 35/18* (2013.01); *H01L 35/08* (2013.01); *H01L 35/32* (2013.01); *H01L 35/34* (2013.01)

(58) Field of Classification Search
CPC ......... H01L 35/08; H01L 35/18; H01L 35/26; H01L 35/34
(Continued)

(56) References Cited

U.S. PATENT DOCUMENTS

| | | | | |
|---|---|---|---|---|
| 5,965,841 A | * | 10/1999 | Imanishi | ................ H01L 35/18 136/240 |
| 6,207,886 B1 | * | 3/2001 | Kusakabe | ............... H01L 35/18 136/201 |

(Continued)

FOREIGN PATENT DOCUMENTS

| CN | 101273474 A | 9/2008 |
|---|---|---|
| CN | 101307392 A | 11/2008 |

(Continued)

OTHER PUBLICATIONS

Notice of Reasons for Refusal dated Mar. 2, 2021, in corresponding Japanese Patent Application No. 2020-549266, citing document AO herein, 5 pages.

(Continued)

*Primary Examiner* — Andrew J Golden
(74) *Attorney, Agent, or Firm* — Oblon, McClelland, Maier & Neustadt, L.L.P.

(57) ABSTRACT

A thermoelectric conversion material includes a sintered body including a main phase including a plurality of crystal grains including Ce, Mn, Fe, and Sb and forming a skutterudite structure, and a grain boundary between crystal grains adjacent to each other. The grain boundary includes a sintering aid phase including at least Mn, Sb, and O. Thus, with respect to a skutterudite-type thermoelectric conversion (Continued)

material including Sb, which is a sintering-resistant material, it is possible to improve sinterability while maintaining a practical dimensionless figure-of-merit ZT, and to reduce processing cost.

5 Claims, 8 Drawing Sheets

(51) Int. Cl.
*H01L 35/32* (2006.01)
*H01L 35/34* (2006.01)

(58) Field of Classification Search
USPC .......................................................... 136/200
See application file for complete search history.

(56) References Cited

U.S. PATENT DOCUMENTS

| | | |
|---|---|---|
| 2007/0095383 A1 | 5/2007 | Tajima |
| 2007/0138710 A1* | 6/2007 | Fukuyama .............. H01L 35/32 264/648 |
| 2009/0152492 A1 | 6/2009 | Ohsora et al. |
| 2011/0120517 A1 | 5/2011 | Li |
| 2015/0069284 A1 | 3/2015 | Murai et al. |
| 2015/0311418 A1* | 10/2015 | Ballinger ................ H01L 35/18 252/62.3 T |
| 2017/0279025 A1 | 9/2017 | Haraguchi et al. |
| 2019/0067548 A1 | 2/2019 | Nakada |

FOREIGN PATENT DOCUMENTS

| | | |
|---|---|---|
| CN | 101307394 A | 11/2008 |
| CN | 100448045 C | 12/2008 |
| CN | 100573948 C | 12/2009 |
| CN | 102881814 A | 1/2013 |
| CN | 103693957 A | 4/2014 |
| CN | 108701749 A | 10/2018 |
| EP | 3 367 449 A1 | 8/2018 |
| JP | 2004-76046 A | 3/2004 |
| JP | 2007-42963 A | 2/2007 |
| JP | 2012-69998 A | 4/2012 |
| JP | 2015-56491 A | 3/2015 |
| JP | 2016-58558 A | 4/2016 |
| JP | 2018-142564 A | 9/2018 |
| WO | WO 2013/009430 A1 | 1/2013 |

OTHER PUBLICATIONS

Combined Chinese Office Action and Search Report dated Jun. 1, 2021 in Chinese Patent Application No. 201980043376.1 (with English translation), citing documents AO-AV therein, 17 pages.

International Search Report dated Nov. 26, 2019 in PCT/JP2019/037494 filed Sep. 25, 2019, citing documents AA-AB, AO-AS and AX therein, 2 pages.

Qiu, P., et al., "Thermoelectric Properties of Manganese-Doped p-Type Skutterudites $Ce_yFe_{4-x}Mn_xSb_{12}$", Functional Materials Letters, vol. 6, No. 5, 2013, pp. 1340003.1-1340003.6.

Extended European Search Report dated Nov. 10, 2021 in corresponding European Patent Application No. 19865620.9 citing document AA therein, 8 pages.

* cited by examiner

THERMOELECTRIC CONVERSION MATERIAL, THERMOELECTRIC CONVERSION MODULE USING SAME, AND METHOD OF MANUFACTURING THERMOELECTRIC CONVERSION MATERIAL

TECHNICAL FIELD OF THE INVENTION

The present invention relates to a thermoelectric conversion material, a thermoelectric conversion module using the same, and a method of manufacturing the thermoelectric conversion material.

BACKGROUND OF THE INVENTION

Significant amounts of thermal energy are currently discharged from large power generating systems such as thermal power plants, steel furnaces, waste incineration plants, and internal-combustion-engine vehicles including automobiles and ships, etc. Although part of the discharged thermal energy is utilized as heat source for hot-water supply systems or for heating systems, most of the discharged thermal energy is wasted without being utilized. The wasted discharged thermal energy that is not utilized is called as unused discharged thermal energy. Efficient utilization and collection of the unused discharged thermal energy can lead to reduction of energy consumption in the whole social system and contribute to solving the energy issues and environmental issues such as global warming.

Thermoelectric generation systems, which convert thermal energy into electrical energy, have been attracting attention as recycling systems for unused discharged thermal energy. Although there are other technologies other than thermoelectric generation, such as the Rankine cycle and thermal energy storage, the former requires a large-scale system and the latter has temperature limitations. On the other hand, the thermoelectric generation system is a small-sized power generation system that can be applied to a wide range of temperature. The thermoelectric generation system uses a thermoelectric conversion module having a plurality of elements in each of which an n-type thermoelectric conversion material with negative electrons as carriers is joined to a p-type thermoelectric conversion material with positive holes as carriers via a conductive material therebetween. When there is a temperature gradient from one side to the other of the thermoelectric conversion materials, in the n-type thermoelectric conversion material, electrons in a valence band in the high-temperature region are excited, which increases the number of electrons contributing to conduction, and the excited electrons are diffused into the low-temperature region so that there is an electric potential gradient and the high-temperature side has a higher voltage. Meanwhile, in the p-type thermoelectric conversion material, the positive holes in the high-temperature region are excited and the positive holes are diffused into the low-temperature region so that, there is an electric potential gradient, and the low-temperature side has a higher voltage. When the n-type thermoelectric conversion material and the p-type thermoelectric conversion material having such properties are connected in series with a conductive material therebetween, thermo-electromotive force is generated and an electric current flows (a phenomenon called as the Seebeck effect), causing it to act like a battery. The thermoelectric generation system provides electric energy obtained by such a method.

That is, the thermoelectric conversion materials used in the thermoelectric conversion module are solid objects that directly exchange energy without carbon dioxide emission, and there is no need for cooling using a coolant such as fluorocarbon gas. Thus, the thermoelectric conversion has been revalued as an ecological energy technology in the recent years.

Technologies relating to thermoelectric conversion materials are described in the following prior arts.

Patent Document 1 describes a method of manufacturing a filled skutterudite alloy, in which an alloy material consisting of a rare earth metal R (where R includes at least one member selected from the group consisting of La, Ce, Pr, Nd, Sm, Eu, and Yb), a transition metal T (where T is either Fe, Mn, Ni, or Os), and a metal antimony (Sb) is melted and the molten metal is rapidly cooled and solidified by a strip cast method. Patent Document 1 describes that the technology described in Patent Document 1 enables easy mass manufacturing of an almost uniformly filled skutterudite alloy by a casting method using the strip cast method. Patent Document 1 also describes that the filled skutterudite alloy manufactured by the technology described in Patent Document 1 can be used directly as a thermoelectric conversion element without pulverization and sintering processes, and thus the production cost for the thermoelectric conversion element can be substantially reduced.

Patent Document 2 discloses a method of manufacturing an n-type skutterudite Yb—Co—Sb thermoelectric conversion material, in which a raw material including at least one of CoSb and $CoSb_2$ is heated with a maximum melting temperature controlled within a range between the peritectic reaction temperature and the liquidus temperature, and then cooled so as to obtain the n-type skutterudite Yb—Co—Sb thermoelectric conversion material without pulverization.

Non-Patent Document 1 describes a thermoelectric material having a skutterudite structure with a main phase represented as $Ce_yMn_xFe_{4-x}Sb_{12}$, which has a high dimensionless figure-of-merit ZT at a working temperature of 500° C. The dimensionless figure-of-merit ZT will be described below. Also, Non-Patent Document 1 describes a spark plasma sintering method (SPS method) for manufacturing a p-type thermoelectric element having a skutterudite structure with a relatively high ZT.

RELATED ART

Patent Documents

[Patent Document 1] Japanese Unexamined Patent Application Publication No. 2004-76046 (JP-A-2004-76046)
[Patent Document 2] Japanese Unexamined Patent Application Publication No. 2012-69968 (JP-A-2012-69968)

Non-Patent Document

[Non-Patent Document 1] PENGFEI QIU et al., THERMOELECTRIC PROPERTIES OF MANGANESE-DOPED p-TYPE SKUTTERUDITES $Ce_yFe_{4-x}Mn_xSb_{12}$, Functional Materials Letters, Vol. 6, No. 5, (2013) 1340003 (6 pages)

SUMMARY OF THE INVENTION

Problems to be Solved by the Invention

Efficiency of a thermoelectric conversion material is evaluated by a figure called the dimensionless figure-ofmerit ZT, and ZT higher than 1 is a standard for its practical use. It is said that a theoretical power efficiency of a thermoelectric conversion material with ZT≅1 is approximately 9%.

The dimensionless figure-of-merit ZT is obtained by a formula:

$$ZT = S^2 \sigma T / \kappa$$

where S represents the Seebeck coefficient; $\sigma$ represents electrical conductivity; $\kappa$ represents thermal conductivity; and T represents absolute temperature.

As shown in the above formula, a high-performance, or a highly efficient thermoelectric conversion material has high electrical conductivity $\sigma$, large Seebeck coefficient S, and low thermal conductivity $\kappa$. However, in general, a thermoelectric conversion material has a correlation in which a material with high electrical conductivity $\sigma$ has high thermal conductivity $\kappa$; while a material with low electrical conductivity $\sigma$ has low thermal conductivity $\kappa$. Thus, it is difficult to increase the dimensionless figure-of-merit ZT.

There is a size limit for the manufacturable thermoelectric conversion element described in Patent Document 1, and this makes it difficult to manufacture a thermoelectric conversion module with required specifications, such as voltage and temperature, using the same.

The thermoelectric conversion material described in Patent Document, 2 is an n-type material, and a p-type material with different composition does not include Co. Thus, sintering using the same method is chemically impossible.

For a p-type composition as in Non-Patent Document 1, sintering process under high pressure using a method such as Spark Plasma Sintering method (SPS) is necessary.

The p-type skutterudite shown in the above document is a sintering-resistant material having poor sinterability. Thus, for the above thermoelectric conversion material, the sintered body is produced under high pressure using a method such as SPS method or Hot Press method (HP method). However, the shapes for molds used for sintering by SPS method or HP method are limited, so the sintered body produced by SPS method or HP method needs to be processed many times following the sintering process to be shaped into the product shape. This may cause a problem of poor yield rate. In addition, the processing steps become complicated, which increases the number of man-hours for processing and may lead to an increase in the unit price of the material. For these reasons, a method that can improve sinterability while maintaining a practical dimensionless figure-of-merit ZT has been desired.

The present, invention was made in view of such problems. Its object, is to provide a method of manufacturing a thermoelectric conversion material, which can reduce processing cost by improving sinterability while maintaining a practical dimensionless figure-of-merit ZT. The present invention also provides a thermoelectric conversion material manufactured by the method and a thermoelectric conversion module using the same.

Means for Solving Problems

The above object can be achieved by the following means.

A thermoelectric conversion material according to the present invention includes a sintered body including: a main phase including a plurality of crystal grains including Ce, Mn, Fe, and Sb and forming a skutterudite structure; and a grain boundary between the crystal grains adjacent to each other, the grain boundary including a sintering aid phase including at least Mn, Sb, and O.

A thermoelectric conversion module according to the present invention includes a plurality of elements. The element includes a thermoelectric conversion material and a reversed-phase thermoelectric conversion material forming a skutterudite crystalline structure and having a reversed phase to the said thermoelectric conversion material. The thermoelectric conversion material and the reversed-phase thermoelectric conversion material are connected via a conductive material.

A method of manufacturing a thermoelectric conversion material according to the present invention includes a weighing step of weighing each of raw materials including Ce, Mn, Fe, and Sb; a mixing step of melting and mixing the raw materials; a ribbon manufacturing step of manufacturing a ribbon by rapidly cooling and solidifying molten metals of the raw materials using a liquid rapid cooling solidification method; a thermal processing step of obtaining polycrystalline grains, the thermal processing step including a step in which the manufactured ribbon is thermally processed in an inert atmosphere where an oxygen concentration is adjusted and a step in which the manufactured ribbon is pulverized; and a sintering step of sintering the polycrystalline grains to manufacture the thermoelectric conversion material.

Effects of the Invention

The present invention can provide a method of manufacturing a thermoelectric conversion material, having high sinterability while maintaining a practical dimensionless figure-of-merit ZT, a thermoelectric conversion material manufactured by the method, and a thermoelectric conversion module using the thermoelectric conversion material.

DESCRIPTION OF SOME EMBODIMENTS

Hereinafter, an embodiment of a thermoelectric conversion material, a thermoelectric conversion module, and a method of manufacturing the thermoelectric conversion material will be described in details.

[Thermoelectric Conversion Material]

Figure 1A:
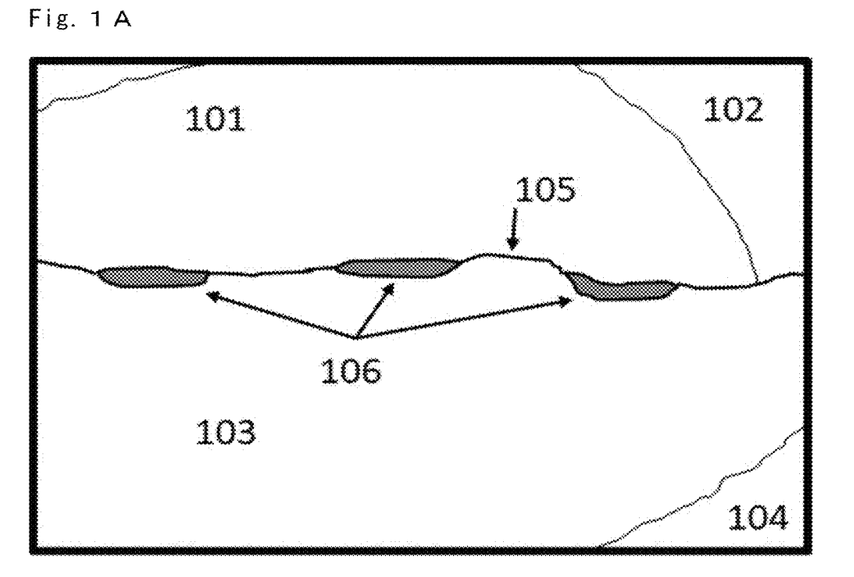
FIG. 1A is a schematic view schematically showing a structure of a thermoelectric conversion material according to the present embodiment.
Figure 1B:
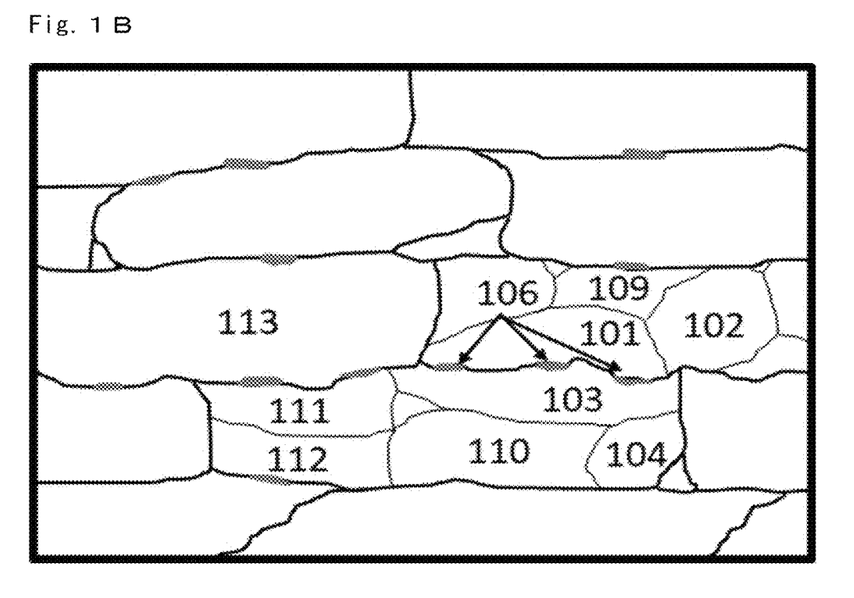
FIG. 1B is a schematic view with a low magnification including an area shown in FIG. 1A.

A thermoelectric conversion material according to the present embodiment includes a sintered body including a main phase and a grain boundary between crystal grains adjacent to each other. The main phase includes a plurality of crystal grains including Ce, Mn, Fe, and Sb and forming a skutterudite structure; and the grain boundary includes a sintering aid phase including at least Mn, Sb, and O. Although the sintering aid phase includes at least Mn, Sb, and O, the sintering aid phase may also include other elements such as Ce and Fe that are included in the main phase. FIG. 1A and FIG. 1B are schematic views schematically showing a structure of a thermoelectric conversion material according to the present embodiment. FIG. 1A is an enlarged view around a center part of FIG. 1B. For example, in FIG. 1A, crystal grains 101, 102, 103, and 104 are main phases. Also, as shown in FIG. 1B, a polycrystalline grain including the crystal grain 101, the crystal grain 102, and a crystal grain 109 is formed. Similarly, the crystal grain 103, the crystal grain 104, a crystal grain 110, a crystal grain 111, and a crystal grain 112 form another polycrystalline grain, which may be formed of further more, i.e. a plurality of, crystal grains. On the other hand, a polycrystalline grain may be formed of one single crystal grain, like a crystal grain 113. The grain boundary exists between crystal grains adjacent to each other. For example, in the grain boundary between the crystal grain 101 and the crystal grain 103, there are a grain boundary 105, in which the crystal grain 101 and the crystal grain 103 are directly sintered, and a discontinuous sintering aid phase 106. Most of the sintering aid phase 106 is considered to be located at a boundary surface of a pulverized ribbon, that is, at boundary surfaces of the adjacent polycrystalline grain (grain boundaries). In the schematic view, borderlines represent the grain boundaries, where thicker lines represent grain boundaries between the polycrystalline grains and thinner lines represent grain boundaries between the crystal grains within the polycrystalline grains. Also, lines within the polycrystalline grains are omitted unless they are used for illustrations. Some of the grain boundaries within the grains of the polycrystalline grains are omitted partly in FIG. 1B. As described below, the sintering aid phase 106 operates to promote sintering between the main phases: for example, we have found that a highly dense sintered body can be obtained by sintering the crystal grain 101 with the crystal grain 103, which are the main phases, (i.e. sintering the main phases of the adjacent polycrystalline grains with each other) through the medium of the grain boundary 105 that includes the sintering aid phase 106. This function of the sintering aid phase 106 enables to sinter a thermoelectric conversion material under an environment with no more than normal pressure without performing HP or SPS processes after the pulverization of ribbons, which will be described below. This can effect a reduction in the process cost. Such the thermoelectric conversion material can be suitably obtained by a method of manufacturing the thermoelectric conversion material, which will be described below.

The sintering aid phase will be described hereinafter. When a cross section of the thermoelectric conversion material is observed by using a surface composition analyzing method such as EPMA or EDX, the sintering aid phase appears in the grain boundary as a composition different from the main phase that forms skutterudite crystalline structure having Ce, Mn, Fe, and Sb. The present, invention defines the sintering aid phase as a phase that includes at least Mn, Sb, and O in the grain boundary. It is found from the above surface composition analysis that some of the sintering aid phases have higher concentrations of Mn and O and lower concentration of Sb compared to the concentrations of Mn, Sb, and O in the main phase. At the same time, it is also found that the sintering aid phase is discontinuously formed in part of the main phase. From the above, it can be guessed that the sintering aid phase exists because a region of part of the ingredient powder where Mn is excessive with regard to Sb is oxidized or the like during the manufacturing process of the thermoelectric conversion material. Moreover, this sintering aid phase is considered to have a lower melting point than the main phase. Thus, it can be considered that existence of such the sintering aid phase enables to promote neck growth between grains of the crystal grains without conventional pressure sintering and to sinter under an environment of no more than the normal pressure.

Concentrations etc. of the sintering aid phase will be described below. The higher a concentration of oxygen in the sintering aid phase is, the higher an electrical resistance becomes, and lower the concentration of oxygen is, the lower the effect of the sintering aid phase becomes. The concentration of oxygen is preferably between 5 and 30 atomic percentage (at %). Also, it is considered that the concentration of Mn and Sb is suitably adjusted throughout, oxidization or forming processes of the main phase, and the oxidization is accelerated in the region where Mn, which is likely to be oxidized, is excessive as described above in preference to the main phase. If elements, other than Mn and Sb, that are more likely to be oxidized than the main phase are included, it is considered that a similar sintering aid phase can be obtained.

With regard to the size of the crystal grain in the main phase, a crystal grain diameter is preferably between 1 μm and 50 μm, for example. The size of the crystal grain within this range facilitates controlling oxygen concentration. Although not limited to this range, the size of the crystal grain can be controlled by suitably changing rapid-cooling speed in a ribbon manufacturing process or heating temperature in a sintering process, for example. In the present embodiment, the crystal grain diameter is determined by being observed under an electron microscope or the like and measured by using a linear analysis method (a method in which arbitrary straight, lines are drawn on an image and the number of the straight lines cutting the grain boundary is counted to calculate an average value from lengths of line segments).

The main phase is formed of polycrystalline grains. The polycrystalline grain is formed of one or more crystal grains. This can be obtained in a manufacturing method, which will be described below, including a ribbon manufacturing step where a ribbon is manufactured by rapid cooling and solidification, a thermal processing step where pulverization and thermal processing are carried out to obtain the polycrystalline grain, and a sintering process where the polycrystalline grain is sintered. At this time, while the crystal grain diameter of the crystal grain is between 1 μm and 50 μm, the size of the polycrystalline grain is not limited to but preferably between 5 μm and 500 μm. The size of the polycrystalline grain in this range facilitates controlling concentrations of oxygen (O) and metal antimony (Sb) in the sintered body. As above, a highly dense sintered body can be obtained even if the polycrystalline grains and crystal grains are mixed, and, since the crystal grain diameter of the crystal grain within the above range enables controlling of the crystallization, it is possible to decrease the thermal conductivity $\square$ of the thermoelectric conversion material.

The thermoelectric conversion material according to the present embodiment is used as a p-type thermoelectric conversion material and includes the sintering aid phase in addition to the main phase. The main phase forms a skutterudite structure of $Ce_yMn_xFe_{4-x}Sb_{12}$ (where y is equal to or less than 1). The composition forming the sintering aid phase is $Ce_\alpha Mn_\beta Fe_\gamma Sb_\delta O_\varepsilon$ including Ce, Mn, Fe, Sb, and O, wherein its atomic ratio is preferably within ranges of: $0 \leq \alpha \leq 3$, $0.1 \leq \beta \leq X2.5$, $0 \leq \gamma \leq 3$, $1 \leq \delta \leq 10$, $0.1 \leq \varepsilon \leq 3$ (provided 5-30 at % O). The sintering aid phase may include impurities within a range where there is no adverse effect on thermoelectric conversion.

[Thermoelectric Conversion Module]

Figure 8:
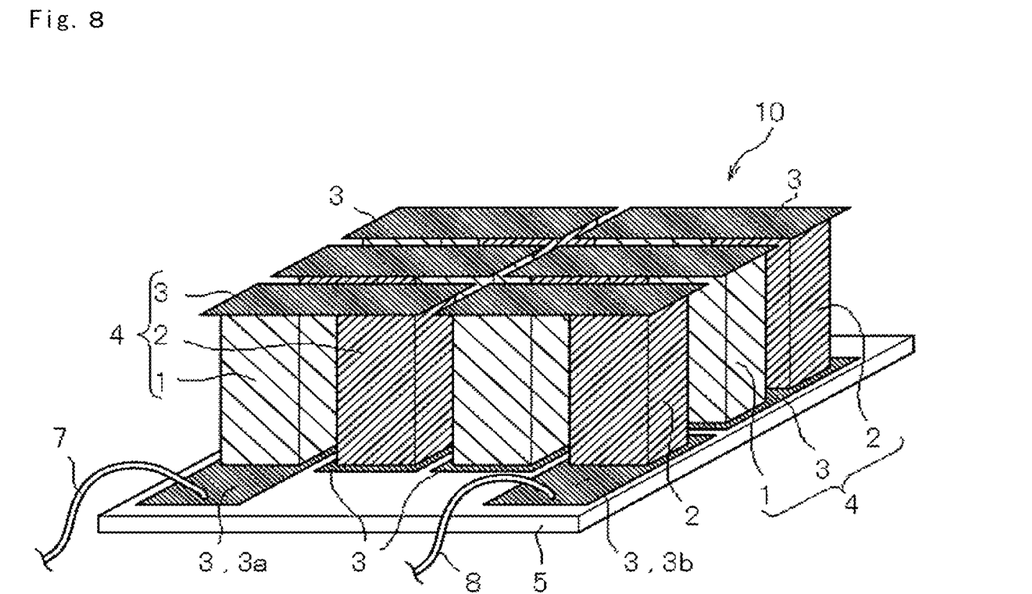
FIG. 8 is a perspective view showing a structure of the thermoelectric conversion module according to the present embodiment, showing a state before mounting an upper substrate.
Figure 9:
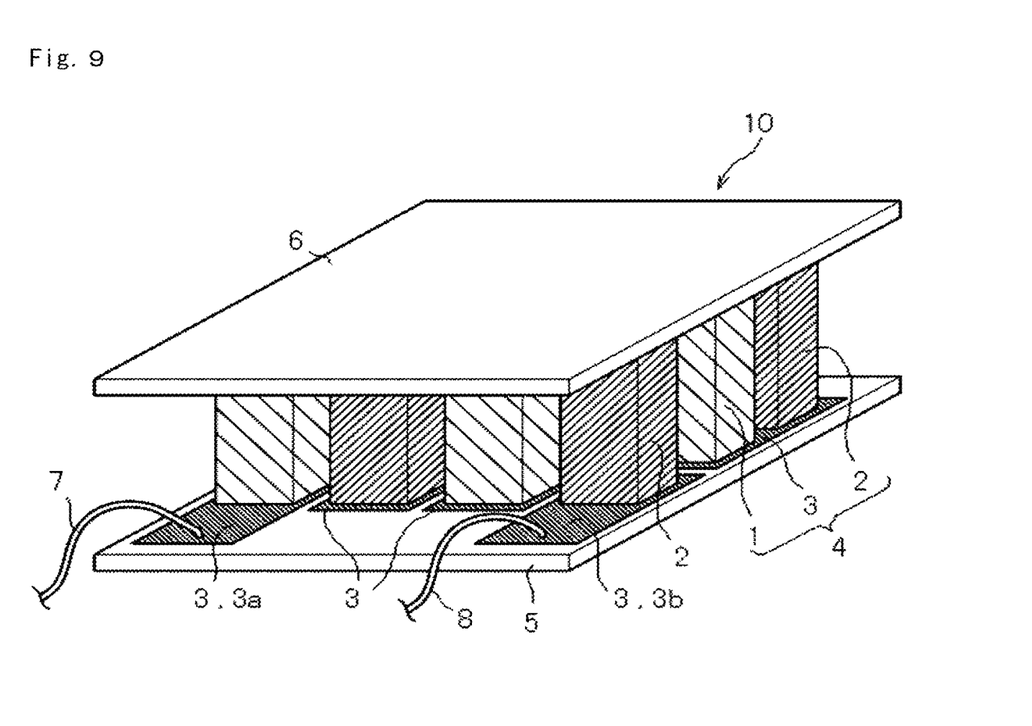
FIG. 9 is a perspective view showing the structure of the thermoelectric conversion module according to the present embodiment, showing a state after mounting the upper substrate.

Next, a thermoelectric conversion module according to the present embodiment will be described. FIG. 8 and FIG. 9 are perspective views showing a structure of the thermoelectric conversion module according to the present embodiment. FIG. 8 shows a state before mounting an upper substrate 6, and FIG. 9 shows a state after mounting the upper substrate 6.

As shown in FIG. 8 and FIG. 9, the above-mentioned thermoelectric conversion material 1 according to the present embodiment can be mounted on a thermoelectric conversion module 10. The thermoelectric conversion module 10 includes a plurality of elements 4. The element 4 includes the column-shaped thermoelectric conversion material 1 that is connected via a conductive material 3 to a column-shaped thermoelectric conversion material 2 having a reversed phase in regard to the thermoelectric conversion material 1. Although not specifically limited, as shown in FIG. 8 and FIG. 9, the thermoelectric conversion material 1 and the reversed-phase thermoelectric conversion material 2 can be connected via the conductive material 3 alternately and electrically in series in the element 4. The element 4 formed of the thermoelectric conversion material 1 and the thermoelectric conversion material 2 that are connected via the conductive material 3 is disposed between a lower substrate 5 and the upper substrate 6 (see FIG. 9). Among the conductive materials 3, a conductive material 3a is connected with the thermoelectric conversion material 1, and a conductive material 3b is connected with the thermoelectric conversion material 2. Moreover, the conductive material 3a is connected with a voltage draw-out wiring 7 for voltage drawing, and the conductive material 3b is connected with a voltage draw-out wiring 8.

Here, for example, the reversed-phase thermoelectric conversion material 2 is n-type when the thermoelectric conversion material 1 is p-type, and thermoelectric conversion material 2 is p-type when the thermoelectric conversion material 1 is n-type. For the conductive material 3, a thin metal material, a film, or a thin coating of copper, silver, gold, platinum, or aluminum, or a metal alloy using a metal selected from the above can be used. The conductive material 3 is not limited to the shapes and metals mentioned above as long as the conductive material 3 is electrically conductive. For example, to be disposed on a lower temperature side, a film formed of electrically conductive polymer can be used as the conductive material 3. For the lower substrate 5 and the upper substrate 6, a plate formed of aluminum nitride (AlN), silicon nitride ($Si_3N_4$), or alumina oxide ($Al_2O_3$) can be used, for example.

In the above-mentioned embodiment of the thermoelectric conversion module 10, heating the upper substrate 6 or contacting the upper substrate 6 with a high temperature part can generate a temperature gradient in the same direction in the thermoelectric conversion material 1 as well as in the reversed-phase thermoelectric conversion material 2. This allows the thermoelectric conversion material 1 and the reversed-phase thermoelectric conversion material 2 to generate thermo-electromotive forces by Seebeck effect. At this time, the thermo-electromotive forces are generated in opposite directions to the temperature gradient in the thermoelectric conversion material 1 and the reversed-phase thermoelectric conversion material 2. Thus, the thermo-electromotive forces do not cancel each other but are added to each other. For this reason, the thermoelectric conversion module 10 can generate a large thermo-electromotive force. Cooling the lower substrate 5 or contacting the lower substrate 5 to a low temperature part may also give the temperature gradient. Also, the lower substrate 5 may be cooled or contacted to the low temperature part while heating the upper substrate 6 or contacting the upper substrate 6 to the high temperature part.

The above-mentioned thermoelectric conversion module according to the present embodiment uses the above-mentioned thermoelectric conversion material 1 according to the present embodiment. Thus, for the same reasons described for the thermoelectric conversion material 1 according to the present embodiment, the thermoelectric conversion module according to the present embodiment also has the high dimensionless figure-of-merit ZT and is highly reliable.

[Method of Manufacturing Thermoelectric Conversion Material]

Figure 10:
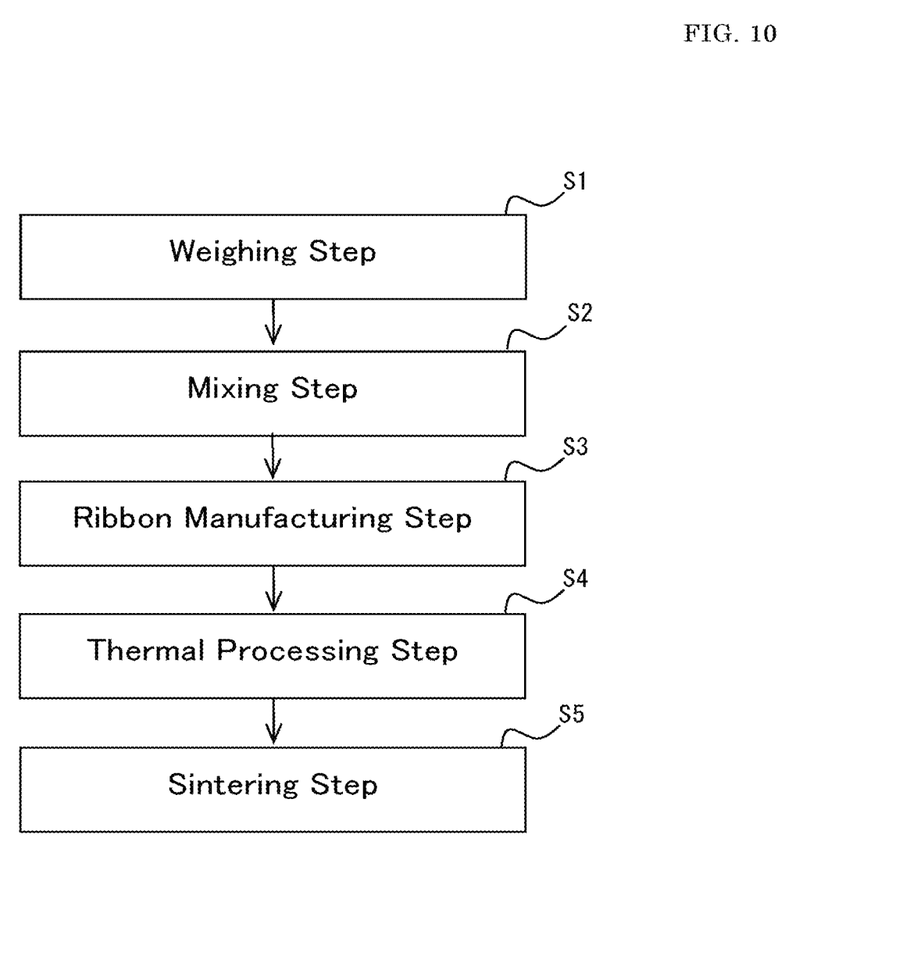
FIG. 10 is a flow chart showing contents of a method of manufacturing the thermoelectric conversion material according to the present embodiment.

Next, a method of manufacturing a thermoelectric conversion material according to the present embodiment will be described. FIG. 10 is a flow chart showing contents of the method of manufacturing the thermoelectric conversion material according to the present embodiment (hereinafter, simply referred to as the present manufacturing method). The present manufacturing method is, for example, a method of manufacturing the above-mentioned thermoelectric conversion material 1 according to the present embodiment.

As shown in FIG. 10, the present manufacturing method includes a weighing step S1, a mixing step S2, a ribbon manufacturing step S3, a thermal processing step S4, and a sintering step S5. Compared to a conventional pressure sintering in which sintering is carried out while applying pressure, the present manufacturing method is characterized in that there is no need to apply pressure in the sintering step. Also, it is preferable that the thermal process step S4 and the sintering process S5 are carried out, without, coming into contact with an oxidized atmosphere, such as the air. This is preferable because this enables to control a very small amount of oxidization of a sintered body. Preferably, the thermal process step S4 and the sintering process S5 are carried out using an airtight furnace. Each of the steps will be described hereinafter.

(Weighing Step S1)

The weighing step S1 is a step of weighing each of a raw material containing Ce, a raw material containing Mn, a raw material containing Fe, and a raw material containing Sb. A normal weighing device can be used to weigh these raw materials. The raw materials may be in any type of forms. That is, the raw material may be an ore, a scrapped material, or a purely refined product, for example. Here, content rates of Ce, Mn, Fe, and Sb contained in each of the raw materials are analyzed in advance, and, based on the analysis, the raw materials are weighed so that the compositions of the materials presented by atomic ratios after weighing are:

$0.85 \leq Ce \leq 1.2$, $0.03 \leq Mn \leq 1.3$, $3 \leq Fe \leq 4$, and $11 \leq Sb \leq 13$. Here, an atomic ratio for Ce:Mn+Fe:Sb is basically 1:4:12, which is a theoretical value of the skutterudite structure, and it is preferable to mix a slightly larger amount of Mn or the like, which forms the sintering aid phase, than this basic value. That is, in the above atomic ratios, it is preferable to have a mixture in which Mn+Fe is slightly larger than 4. However, since Ce is more likely to be oxidized compared to the other elements and Sb is more likely to volatile compared to the other elements, Ce and Sb are more likely to decrease during the manufacturing steps. Because part of Ce and Sb that are mixed as above does not contribute to the formation of the main phase, even if the mixture is in the ratio of Ce:Mn+Fe:Sb=1:4:12, Ce and Sb substantially decrease during the manufacturing process and the atomic ratio of Mn+Fe relatively increases beyond 4. Thus, when Ce:Mn+Fe:Sb are mixed with the theoretical value 1:4:12 of the atomic ratio, excessive Mn and the like can form the sintering aid phase. Although details will be described below, an amount of substitutable Mn at an Fe site in the main phase (the skutterudite structure) is extremely small, and thus too much amount of Mn mixed causes decrease in the main phase. For this reason, an atomic ratio of Mn/(Mn+Fe) is preferably 8% or less.

Also, it is preferable that the weighing is carried out inside a sealed work device such as a glove box, where operation is possible in an environment separated from the outside air. It is preferable to use a sealed work device that, can supply inert gas, such as nitrogen or argon, to the inside. The weighing is preferably carried out in a sealed work device where oxygen concentration is between 0.1 vol.ppm and 100 vol.ppm. The raw material weighed inside the sealed work device is preferably placed inside a heat-resistant container such as a graphite crucible. It is also preferable to put the raw material that has been weighed inside the sealed work device into a quartz container which is then vacuum sealed. Although any one of these forms can prevent excessive (more than necessary) oxidization of the raw material, it is preferable to do all of the above. As described below, although excessive oxidization is undesirable in the present embodiment, it is considered that oxidization that slightly oxidizes only a phase containing more Mn than the main phase can form the sintering aid phase, which has a lower melting point than that of the main phase. It is also considered that, since such the sintering aid phase exists, a neck growth between grains can be promoted without applying pressure at a sintering temperature, and thus sintering can be performed under an environment of no more than normal pressure.

(Mixing Step S2)

The mixing step S2 is a step in which the above-mentioned raw materials are melted and then mixed. The raw materials are melted at a temperature of 1020° C. or higher, or more preferably at a temperature of 1050° C. or higher, for example. From the perspectives of cost, maintenance of a heating device, and the like, the raw materials are melted at a temperature of 1300° C. or lower, or more preferably at a temperature of 1100° C. or lower. Preferably, the raw materials are kept for melting at the above temperature for several to several ten hours, and then cooled down rapidly. For example, it is preferable to keep the raw materials for melting at the above temperature for 20 hours and then put the raw materials into cool water at a temperature of 20° C. for rapid cooling, for example. If there are many raw materials, slow cooling is also acceptable. After rapid cooling, an ingot is taken out of the quartz container within an inert atmosphere and then preferably loaded to a heat-resistant container such as a graphite crucible. Alternatively, it is possible to take out and load the ingot to the heat-resistant container within the air if the operation can be done in a short time of an hour or less. It is more preferable that the ingot is placed inside the graphite crucible instead of the quartz container and melted in vacuum by using a high-frequency melting furnace. High-frequency melting causes mixing of molten metal, which can shorten the melting time. The equivalent ingot can also be obtained by melting inside argon. After that, for example, the ingot is heated again by the high-frequency heating furnace up to 1100° C. to be molten metal. The molten metal of the melted raw materials may be used in the following ribbon manufacturing step S3.

(Ribbon Manufacturing Step S3)

The ribbon manufacturing step S3 is a step in which the molten metal of the raw metals is rapidly cooled and solidified by a liquid rapid cooling solidification method to manufacture a ribbon. The liquid rapid cooling solidification method is a method in which the melted metal (the molten metal) is dropped onto a rotating metal roll and cooled down at a faster speed than a nucleation speed of a crystal so as to produce a non-crystalline metal ribbon. A thickness of the ribbon obtained by the ribbon manufacturing step S3 is preferably 200 μm or less. If the ribbon has a thickness within this range, uniformity of its structure is high and also degree of oxidization can be easily controlled. Similarly as above, the ribbon manufacturing step S3 is also carried out in an inert atmosphere.

(Thermal Processing Step S4)

The thermal processing step S4 is a step to obtain polycrystalline grains, which are pulverized grains. The thermal processing step S4 includes: a step in which the manufactured ribbon is thermally processed in an inert atmosphere where an oxygen concentration is adjusted (not shown in FIG. 10); and a step in which the manufactured ribbon is pulverized (not shown in FIG. 10). That is, in the thermal processing step S4, the ribbon may be thermally processed inside an inert atmosphere with an adjusted oxygen concentration and then pulverized to obtain polycrystalline grains that are pulverized grains. Alternatively, in the thermal processing step S4, the ribbon may be pulverized first to obtain polycrystalline grains that are pulverized grains, and the polycrystalline grains are then thermally processed inside an inert atmosphere with an adjusted oxygen concentration. The order of thermal processing and pulverization can be switched within the thermal processing step.

Here, in general, keeping the oxygen concentration of the atmosphere low in the thermal processing step can prevent oxidization of materials. Thus, conventionally, it has been a common knowledge that the thermal processing step is carried out in vacuum or in an inert gas with the oxygen concentration as low as possible. In the present embodiment, on the other hand, if the oxygen concentration is too low, oxygen induction effect of Ce that works as an oxygen derivative becomes lower, and thus the oxygen concentration is preferably controlled to be over a predetermined value. However, if the oxygen concentration is too high, oxidization of materials progress excessively. For this reason, it is preferable that, in the present embodiment, the oxygen concentration is adjusted, at least during a part of the time of thermal processing, between 500 vol.ppm and 5 vol.ppm, or more preferably between 5 vol.ppm and 10 vol.ppm. The oxygen concentration control during the thermal processing will be described below.

Before thermal processing, it is preferable to re-load the ribbon, or the polycrystalline grains, to a heat-resistant container, such as a graphite crucible, and to put a lid on the container inside a sealed work device (with an oxygen concentration between 0.1 vol.ppm and 100 vol.ppm). A depth dimension of the lid of the heat-resistant container is preferably thick so that the oxygen concentration inside the heat-resistant container can be reduced. The depth dimension of the lid of the heat-resistant container is preferably between 5 and 10 cm. Also, to reduce the oxygen concentration inside the heat-resistant container, a getter material such as metal Ti is preferably loaded.

As mentioned above, the oxygen concentration in the inert atmosphere during the thermal processing step S4 is preferably 5 vol.ppm or more, for example. In this way, only a surface of the ribbon can be slightly oxidized. In the present embodiment, excessive oxidization is undesirable, and yet it is desirable to slightly oxidize the surface of the ribbon or surfaces of the polycrystalline grains. In the present embodiment, introduction of oxygen during the thermal processing step may be for a short time. For example, the content of oxygen in the heating atmosphere is suitable for forming the sintering aid phase if the oxygen concentration is controlled within a range of 0 to 10 vol.ppm so that the oxygen concentration is 5 vol.ppm or more for at least one or more hours in a low temperature range of about 500° C., and then controlled to be 1 vol.ppm or less in a high temperature range. For example, preferably, the thermal processing with the controlled oxygen concentration can increase an oxygen content of the material to a range between 300 ppm and 700 ppm compared to the oxygen content between 100 ppm and 300 ppm of the material before the thermal processing (provided that the oxygen concentration after the thermal processing is increased by 200 ppm to 400 ppm from the oxygen concentration before the thermal processing).

At least, but not limited to, one of nitrogen and argon, for example, may be the inert atmosphere. For example, a mixed gas of hydrogen and argon, a mixed gas of hydrogen and nitrogen, or hydrogen gas used solo may also be the inert atmosphere. The inert atmosphere may include vapor. Oxidization can be slightly accelerated if there is vapor included. Also, regulation of the oxygen concentration of the inert atmosphere can be done by regulating a flow rate of the above gas. For example, the oxygen concentration inside the furnace can be controlled by regulating the flow rate of the gas while monitoring the oxygen concentration inside the furnace.

A condition for thermal processing in the thermal processing step S4 is, for example, a thermal processing temperature of 500 to 800° C. Also, for example, in a case of the thermal processing temperature of 700° C., a thermal processing time may be 3 hours or more and less than 168 hours. The thermal processing time is preferably 48 hours or less in a viewpoint of preventing extreme oxidation of the ribbon or the polycrystalline grains.

Pulverization of the ribbon is preferably carried out inside a sealed work device (oxygen concentration between 0.1 and 100 vol.ppm). The polycrystalline grain obtained after pulverization preferably has a median diameter (d50) of between 10 and 100 μm. In this way, the polycrystalline grains easily come into contact with oxygen, which facilitates controlling of the oxygen concentration and obtaining a precise sintered body in the following sintering step. A diameter of the grain is measured by "Laser diffraction and diffusion method" JIS 28825 (2013) (corresponding to ISO13320). Pulverization of the ribbon can be done by, for example, using a mortar and pestle, a ball mill, a rod mill, a high-pressure pulverizing roll, a vertical axis impact mill, or a jet mill. Also, more precise formed body can be obtained by molding using a binder during the pulverization step. Furthermore, classification may be carried out. A classification step classifies the pulverized polycrystalline grains by using a metal filter, separating finer powder floating in the argon air flow.

After mixing the polycrystalline grains having various grain diameters for the purpose of filling the gaps created due to molding, the polycrystalline grains may be pressed. Also, before the sintering step, the polycrystalline grains may be loaded to a mold and applied with pressure in advance for a near net shape processing. Followed by weighing the polycrystalline grain in a sealed work device, pressure is applied in advance suitably for molding according to the grain diameter and shapes that are adjusted after the pulverization and classification. For example, it is preferable to load the polycrystalline grains to a die of a uniaxial press machine, yet the die to the press machine, and mold the polycrystalline grains under a low pressure (less than 200 MPa) for a short holding time (less than 10 sec.) so as not to cause laminate cracks. Alternatively, the polycrystalline grains may be loaded to a rubber mold for CIP (Cold Isostatic Press), which is then vacuum sealed by plastic and set to the CIP, and molded under a pressure of more than 300 MPa. This method hardly cause laminate cracks and thus is preferable. Furthermore, by combining the above, a molded body obtained by the uniaxial press machine may be vacuum sealed by plastic without using a rubber mold, and then CIP is carried out. This is preferable because it allows to mold with accuracy in size and to have a high mold density. Applying pressure prior to sintering as above can mold the material before sintering into a shape that is almost the same as the final product shape. For example, in pressured sintering, an approximately cylindrical shape is obtained because of limitations in the shape or the like of the metal mold. Whereas in the present embodiment, applying pressure is unnecessary at the time of sintering and it is possible to sinter a mold, which has been applied pressure in advance, having a shape that is similar to the final product shape, and thus processing after sintering can be reduced.

(Sintering Step S5)

The sintering step S5 is a step in which the above-mentioned thermoelectric conversion material 1 according to the present embodiment is manufactured by sintering the polycrystalline grains, which has been thermally processed in the thermal processing step S4, in an inert atmosphere under pressure that is no more than the normal pressure. That is, the sintering step S5 is a step in which the above-mentioned thermoelectric conversion material 1 according to the present embodiment is manufactured by sintering without letting the polycrystalline grains contact with an oxidized atmosphere (the air, for example) after the thermal processing step S4 until the end of the sintering step S5. Here, an inert atmosphere means non-oxidized atmosphere and preferably an environment with the oxygen concentration of 1% or less. Such an inert atmosphere can be suitably realized by eliminating oxygen from the air inside the furnace by repeating a process of vacuum drawing until 10 Pa or less and replacing the air with argon (Ar) gas for three times, for example. Other than argon, sintering may be carried out in an environment of nitrogen, 1 to 3% of hydrogen (the rest is nitrogen or argon), a vacuum (less than 10 Pa), or an environment of combination of the above. In particular, sintering in a vacuum after hydrogen processing (introducing hydrogen and heating at a temperature under sintering temperature to remove excessive oxygen on the surface of the material) is preferable since a liquid phase and non-liquid phase sintering are likely to occur.

Also, more preferably, in this sintering step S5, the above hydrogen processing may be carried out prior to sintering and a reducing atmosphere brought by the hydrogen processing may be exchanged with the inert atmosphere. For example, as mentioned above, after the hydrogen processing, the reducing atmosphere inside the sintering device is vacuum drawn until approximately 10 Pa and is replace by the inert atmosphere. At this time, the operation is carried out without exposing the sintering device to the air. At least, but not limited to, one of nitrogen and argon, for example, may be the inert atmosphere. The argon atmosphere is preferable as the inert atmosphere. Also, to replace the reducing atmosphere with the inert atmosphere, the replacing operation mentioned above is preferably repeated twice, or, more preferably, three or more times. A batch furnace may be used as the sintering device, for example. In this step, exposing to the air for as short as 2 hours before vacuum drawing is tolerable.

After replacing with the inert atmosphere, the temperature inside the sintering device is raised at a temperature-raising rate of 300 to 600° C./h and kept at a temperature between 600 and 800° C. for an hour. After keeping, the sintering device is cooled down at a cooling rate of 500° C./h or less. Cooling is preferably done naturally inside the sintering device. With the operations thus far, the thermoelectric conversion material 1 according to the present embodiment can be suitably manufactured. As mentioned above, applying pressure is not essential during sintering in the present embodiment.

(Post Processing)

A carbon mold containing the manufactured thermoelectric conversion material 1 is taken out of the sintering device, and the thermoelectric conversion material 1 (a sintered body) is taken out of the heat-resistant container. After removing debris on surfaces of the thermoelectric conversion material 1, the thermoelectric conversion material 1 is cut out into a required size and shape by using a precision processing machine. These operations can be done in the air. The precision processing machine used is preferably equipped with a diamond blade. Also, if necessary, the Seebeck coefficient, electrical conductivity, specific heat, and thermal conductivity of the material can be measured by using commonly known methods.

WORKING EXAMPLES

Next, working examples and comparison examples of the thermoelectric conversion material and the method of manufacturing the thermoelectric conversion material according to the present invention will be described. Test pieces 1 to 19 are made and analyzed according to the following procedures [1] to [4]. Here, the test pieces 1 to 7 and 10 to 17 are made and analyzed according to the procedure [2A] (however, no prior press pressure for the test pieces 1 and 10). The test pieces 8, 18, and 19 are made according to the procedure [2B]. There is no prior press or sintering press applied to the test piece 9. Table 1 shows manufacturing procedures used and results of the analysis for the test pieces 1 to 19 together with other conditions.

[1] (Weighing Step, Mixing Step, Ribbon Manufacturing Step)

Raw materials of Ce, Mn, Fe, and Sb are prepared and weighed inside a glove box with an oxygen concentration between 0.1 and 100 vol.ppm so that the ratio of the materials is $CeMn_{0.075}Fe_{3.925}Sb_{12}$. The weighed materials are loaded to a graphite crucible and introduced into a high-frequency vacuum melting furnace. The temperature in the furnace is raised up to 1080° C. and kept until melting is completed. Melting is completed within ten minutes and the furnace is slowly cooled down. An ingot is taken out of the cooled graphite crucible in the air and promptly loaded to a rapid-cooling graphite crucible to prevent acceleration of oxidization. This is then heated in a high-frequency heating furnace to 1050° C. or higher and melted again. The molten metal is dropped onto a copper roll by using a liquid rapid cooling solidification method to produce a rapidly cooled ribbon.

[2A] (Thermal Processing Step, Pulverization Step, Molding Step, Sintering Step)

The rapidly cooled ribbon is loaded again to the graphite crucible inside the glove box and then thermally processed in an annealing furnace for 24 hours at 660° C. in an argon flow with an oxygen concentration controlled between 5 and 10 vol.ppm. Then, the thermally processed rapidly cooled ribbon is taken out inside the glove box, pulverized by using a hammer mill, and classified and produced into pulverized powder with d50 between 10 and 100 μm (rough powder) and minute pulverized powder floating in the argon flow with d50 less than 10 μm (fine powder). The obtained rough powder is taken out of the glove box, weighed for a predetermined amount inside a draft, and molded in advance by using a uniaxial press machine or CIP. The fine powder is also taken out of the glove box, weighed for a predetermined amount inside a draft, and molded in advance by using a uniaxial press machine or CIP. The test piece 15 is preparatory molded by uniaxial press first and then CIP molded without using a rubber mold. The temperature of the obtained molded body is raised by a hot press machine at a temperature-raising rate of 300 to 600° C./h and kept at 660° C. for an hour and twenty minutes in vacuum. At this time, press pressure is not applied at all (non-pressurization). After keeping, this is then cooled down at a cooling rate of approximately 500° C./h.

[2B] (Thermal Processing Step, Pulverization Step, Sintering Step)

The rapidly cooled ribbon is loaded again to the graphite crucible inside the glove box and then thermally processed in an annealing furnace for 24 hours at 660° C. in an argon flow with an oxygen concentration controlled between 5 and 10 vol.ppm. Then, the thermally processed rapidly cooled ribbon is taken out, inside the glove box, pulverized by using a hammer mill, and classified and produced into pulverized powder with d50 between 10 and 100 μm (rough powder) and minute pulverized powder floating in the argon flow with d50 less than 10 μm (fine powder). Without molding by uniaxial press machine or CIP, both the obtained rough powder and fine powder are weighed inside the glove box, loaded to a carbon mold inside a draft, and introduced into a hot press machine. The hot press machine raises the temperature at a temperature-raising rate of 300 to 600° C./h and keeps the temperature at 660° C. for an hour and twenty minutes. At this time, the test pieces, except for some thereof, are applied with pressure at a rate equivalent to the temperature-raising rate so that a press pressure (applied pressure) is 68 MPa at the kept temperature. After keeping, this is then cooled down at a cooling rate of approximately 500° C./h and the applied press pressure is released.

[3] (Post Processing)

The carbon mold is taken out, of the hot, press machine and a sintered body is taken out in the air. After removing debris on surfaces of the sintered body, a rectangular parallelepiped body of 3 mm square by 10 mm length is cut out by using a precision processing machine equipped with a diamond blade, and its Seebeck coefficient and electrical conductivity are measured. Also, a small piece of 2 to 3 mm square by 2 mm thickness and a square plate of 10 mm square by 1 mm thickness are cut out from the same sintered body, and their specific heat and thermal diffusivity are measured, respectively.

[4] (Analysis)

Furthermore, oxygen concentrations of the rapidly cooled ribbon, the thermally processed ribbon, and the sintered body are measured by a fusion oxygen concentration analyzing method, and their compositions are analyzed by ICP (induction coupling plasma) analyzing method. As a result, for both the steps 2A and 2B, the amount of oxygen of the material before thermal processing is 100 ppm or more and less than 300 ppm, the amount of oxygen of the material after thermal processing with the controlled oxygen concentration is 300 ppm or more and 700 ppm or less (provided that the oxygen concentration is increased from prior to the thermal processing to after the thermal processing by 200 ppm or more and 400 ppm or less), and the oxygen concentration of the material after sintering is 400 ppm or more and 900 ppm or less (provided that the oxygen concentration is increased from after the thermal processing to after the sintering by 100 ppm or more and 200 ppm or less). Identification of the composition and crystalline structure are done by using a scanning electron microscope together with an X ray diffraction device. A density of the sintered body is measured by using the Archimedes method. Here, it is decided that sinterability is sufficient if the density of the test piece is 7 g/cm$^3$ or more and there is no change in its underwater weight for three minutes or longer by the Archimedes method. Here, 'no change in underwater weight' means that there is no change in weight, at the time of calculating the density by the Archimedes method, that can affect the value of density which has three significant figures.

TABLE 1

| Test Piece | Procedure 2 | Powder Size | Prior Press Method | Prior Press Pressure (Mpa) | Press Size (mm) | Sintering Temperature (° C.) | Sintering Time (min) | Atmosphere | Press Pressure in Sintering (MPa) | Density after Sintering (Archimedes) (g/cm$^3$) | Seebeck Coefficient (μV/K) | Electrical Conductivity (10$^5$ S/m) | PF (mW/mK$^2$) |
|---|---|---|---|---|---|---|---|---|---|---|---|---|---|
| 1 | A | Rough Powder | Uniaxial | 0 | φ14 | 730 | 80 | Vacuum Evacuation | 0 | 7.41 | — | — | — |
| 2 | A | Rough Powder | Uniaxial | 50 | φ10 | 730 | 80 | Vacuum Evacuation | 0 | 7.46 | — | — | — |
| 3 | A | Rough Powder | Uniaxial | 80 | φ10 | 730 | 80 | Vacuum Evacuation | 0 | 7.40 | — | — | — |
| 4 | A | Rough Powder | Uniaxial | 100 | φ10 | 730 | 80 | Vacuum Evacuation | 0 | 7.46 | — | — | — |
| 5 | A | Rough Powder | Uniaxial | 200 | φ10 | 730 | 80 | Vacuum Evacuation | 0 | 7.51 | — | — | — |
| 6 | A | Rough Powder | CIP | 490 | φ23 | 730 | 80 | Vacuum Evacuation | 0 | 7.64 | 153.2 | 1.43 | 3.36 |
| 7 | A | Rough Powder | CIP | 980 | φ23 | 730 | 80 | Vacuum Evacuation | 0 | 7.70 | 153.6 | 1.46 | 3.44 |
| 8 | B | Rough Powder | — | 0 | — | 660 | 80 | Ar | 68 | 7.88 | 160.0 | 1.40 | 3.50 |
| 9 | B | Rough Powder | — | 0 | — | 660 | 80 | Ar | 0 | 7.27 | — | — | — |
| 10 | A | Fine Powder | Uniaxial | 0 | φ14 | 730 | 80 | Vacuum Evacuation | 0 | 7.56 | — | — | — |
| 11 | A | Fine Powder | Uniaxial | 14 | φ20 | 730 | 80 | Vacuum Evacuation | 0 | 7.74 | 138.0 | 1.66 | 3.17 |
| 12 | A | Fine Powder | Uniaxial | 50 | φ20 | 730 | 80 | Vacuum Evacuation | 0 | 7.74 | 140.0 | 1.61 | 3.15 |
| 13 | A | Fine Powder | Uniaxial | 100 | φ10 | 730 | 80 | Vacuum Evacuation | 0 | 7.75 | — | — | — |
| 14 | A | Fine Powder | Uniaxial | 200 | φ10 | 730 | 80 | Vacuum Evacuation | 0 | 7.69 | — | — | — |
| 15 | A | Fine Powder | Uniaxial + CIP | Uniaxial: 50 | φ20 | 730 | 80 | Vacuum Evacuation | 0 | 7.69 | — | — | — |
| 16 | A | Fine Powder | CIP | 490 | φ23 | 730 | 80 | Vacuum Evacuation | 0 | 7.68 | — | — | — |
| 17 | A | Fine Powder | CIP | 980 | φ23 | 730 | 80 | Vacuum Evacuation | 0 | 7.68 | — | — | — |
| 18 | B | Fine Powder | — | 0 | — | 730 | 80 | Ar | 68 | 7.84 | — | — | — |
| 19 | B | Fine Powder | — | 0 | — | 660 | 80 | Ar | 68 | 7.82 | — | — | — |

As shown in Table 1, a sample according to the test piece 9 is not prior pressed or pressured during the sintering and has a relatively low sintering density. However, the sintering aid phase promotes densification, and thus the test piece 9 satisfies the above standard and its sinterability is considered to be sufficient. The sintering aid phase is also seen in the other test pieces, and densification is promoted similarly as in the test pieces 8, 18, and 19, which are pressure sintered. A sample according to the test piece 1 has a high density. The reason for this is considered as that oxidization of Mn or Mn and Ce is promoted and introduction of liquid phase sintering aid phase is possible. The produced test pieces are found to have high densities if conditions for press during the prior pressurization are met. Although not molded by the uniaxial press but molded by a hydrostatic pressure press (CIP), the sintered bodies with high densities can also be obtained from the samples according to the test pieces 6 and 7 without HP or SPS processing. Compared to the test pieces 1 to 7 of rough powders that are not applied with pressure during the sintering, the densities after sintering are likely to be higher if the fine powders of the test pieces 10 to 17 are used.

Furthermore, thermoelectric properties of some of the test pieces are measured. The Seebeck coefficient and electrical conductivity are measured by ADVANCE RIKO's ZEM-3. The Seebeck coefficient and electrical conductivity are measured under standard measurement conditions recommended by the manufacturer of the device. The test piece is processed into a shape having two end faces, and its Seebeck coefficient is measured by heating the end faces of the test piece with a temperature differential heater so as to provide a temperature difference between the two end faces of the test piece, and pressing probes of thermocouples against the side faces to measure the temperature difference and electromotive force between the thermocouples. Electric resistance is measured by a direct current four-terminal method. Thermal conductivity is calculated from specific heat, thermal diffusivity, and density. The specific heat is measure by Perkin-Elmer's Pyris1, which is a power compensation differential scanning calorimeter, and the thermal diffusivity is measured by NETZSCH's LFA467, which performs a laser flash method. According to the above, the test piece 12, for example, has the Seebeck coefficient of 140 µV/K and the electrical conductivity of $1.61 \times 10^5$ S/m, and its power factor (PF) is 3.15 mW/mK$^2$. The same measurement is carried out for the test pieces 6, 7, 8, and 11 and their power factors are approximately 3 mW/mK$^2$ or more, which shows that they have by no means inferior properties.

Although not shown in Table 1, comparison examples are produced with zero Mn composition. The raw materials of Ce, Fe, and Sb are prepared and weighed so as to be CeFe$_4$Sb$_{12}$ and the comparison test pieces are produced under the same conditions as the other test pieces. The uniaxial press is chosen as the prior molding method in the procedure [2A], where the press pressure is 50 MPa, 100 MPa, and 200 MPa. However, none of these test pieces meet with the above-mentioned standard of the density after sintering and are densified. Thus, it is considered that their sinterability is insufficient. Also, those materials thermally processed inside vacuum (with an oxygen concentration of less than 5 vol.ppm) have the amount of oxygen of 80 ppm after thermal processing and no sintering aid phase generated. Thus, we concluded that since their densities after sintering without applying pressure do not satisfy the above-mentioned standard, which lead to no densification, their sinterability is insufficient.

FIG. 1A is a schematic view showing joining parts (sintered parts) of the test pieces shown in Table 1. In FIGS. 1A, 101, 102, 103, and 104 are crystal grains of a main phase having a skutterudite structure, and the crystals gather to form polycrystalline grains, such as 101 with 102, or 103 with 104. In FIG. 1A, the polycrystalline grain is formed of two crystal grains, whereas, when observed under larger scale, the polycrystalline grain may include three or more crystal grains as a structure shown in FIG. 1B. A structure called a grain boundary is formed between the polycrystalline grain formed of the crystal grains 101, 102, and so on and the polycrystalline grain formed of the crystal grains 103, 104, and so on.

For example, the grain boundary between the crystal grain 101 and the crystal grain 103 is formed of a sintering aid phase 106, which acts as a sintering aid, and a grain boundary 105 where the crystal grain 101 and the crystal grain 103 are directly sintered.

Figure 2:
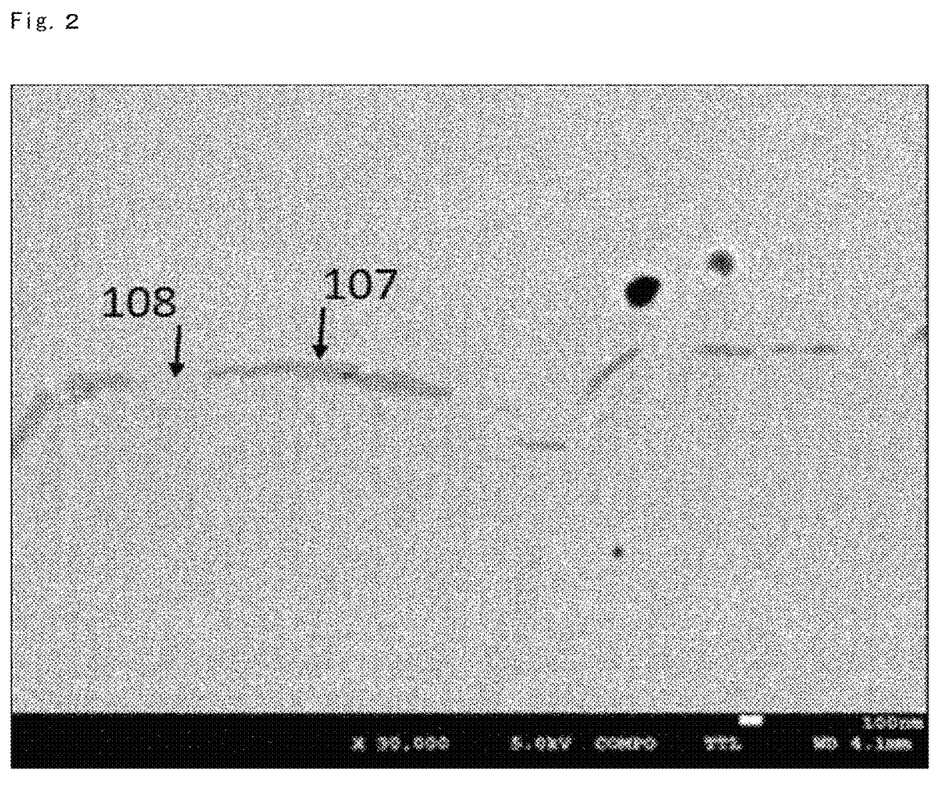
FIG. 2 is a cross-sectional SEM image of the thermoelectric conversion material immediately after start of a sintering process.

FIG. 2 is an image of pulverized powder of the test piece 9 shown in Table 1, which is observed under an electron microscope immediately after a start of the sintering to observe the sintering process of a surface of the sintered body. As shown in FIG. 1A, the grain boundary is seen in the actual sintered body, and it can be seen that a sintering aid phase 107 and a directly joining portion 108 are generated along the grain boundary. This image shows that the sintering aid phase 107 is formed in the grain boundary discontinuously and that this sintering aid phase 107 prompts the main phase crystals to directly join with each other to form the joining part 108.

Figure 3:
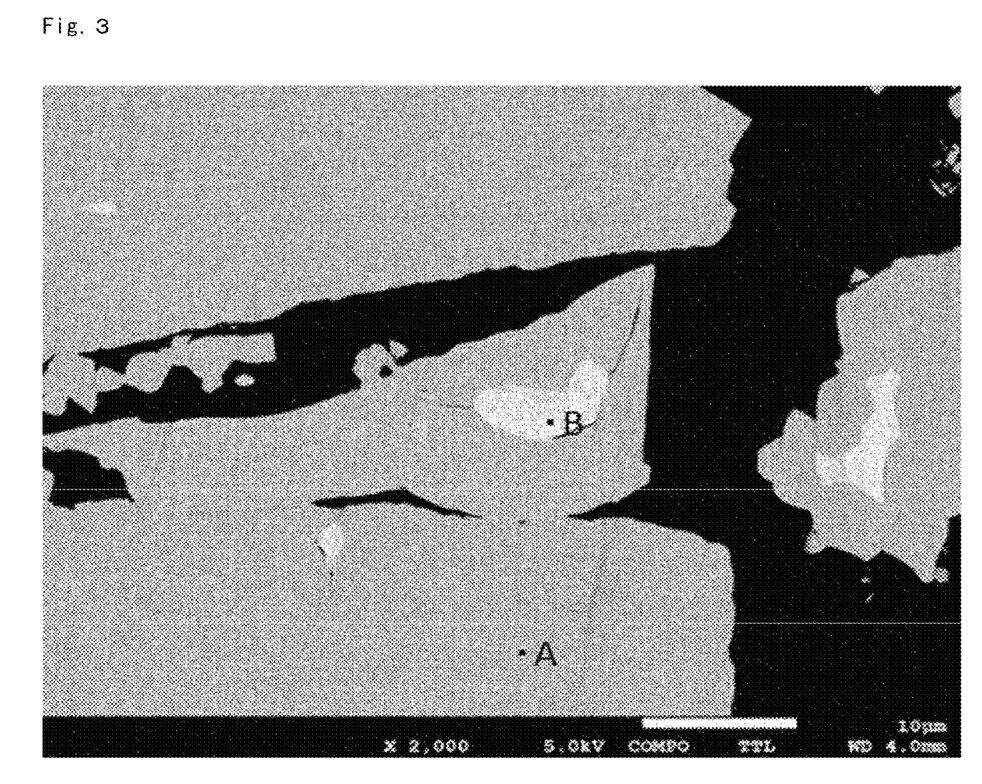
FIG. 3 is a cross-sectional SEM image with a low magnification including an area shown in FIG. 2.

FIG. 3 shows a result of observing the early stage of the sintering process of the same test piece 9. Analyzing points A and B in FIG. 3 and the analyzing point C that will be described below are EDX analyzed and their results are shown in Table 2. An analyzing region for bulk is a 200 µm square and other analyzing regions are □1 µm. From the results, the analyzing point, A is a main phase having a skutterudite structure, and the analyzing point B is a deposition phase that seems like CeSb$_2$. This suggests that Ce used in this deposition phase alters the main phase, giving an example of a phenomenon that prompts forming of the sintering aid phase.

TABLE 21

| | [at %] | | | | |
|---|---|---|---|---|---|
| | Ce | Mn | Fe | Sb | O |
| Bulk | 5.9 | 0.5 | 21.8 | 67.5 | 4.3 |
| A | 5.5 | 0.2 | 23.4 | 70.5 | 0.4 |
| B | 34.0 | — | 0.4 | 65.7 | — |
| C | 13.7 | 9.5 | 13.9 | 55.8 | 7.1 |

Figure 4:
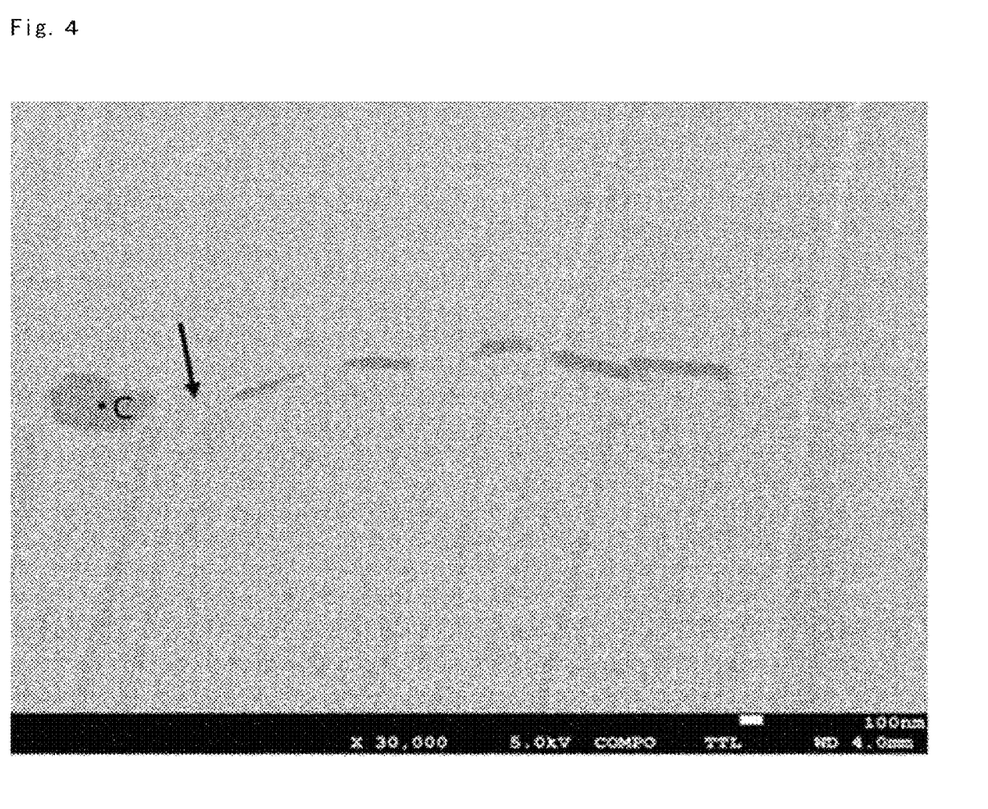
FIG. 4 is a cross-sectional SEM image showing the other area of FIG. 2 of the thermoelectric conversion material immediately after start of the sintering process.

FIG. 4 is an enlarged view of a part in FIG. 3 starting to sinter. The analyzing point C is a sintering aid phase that worked as the sintering aid. As a result of the point analysis, it is found that the sintering aid phase has a composition closer to Ce$_2$Mn$_{1.2}$Fe$_2$Sb$_8$O. The slight amount of oxygen is considered to be a solid solution existing in a small amount in the intermetallic compound.

Figure 5:
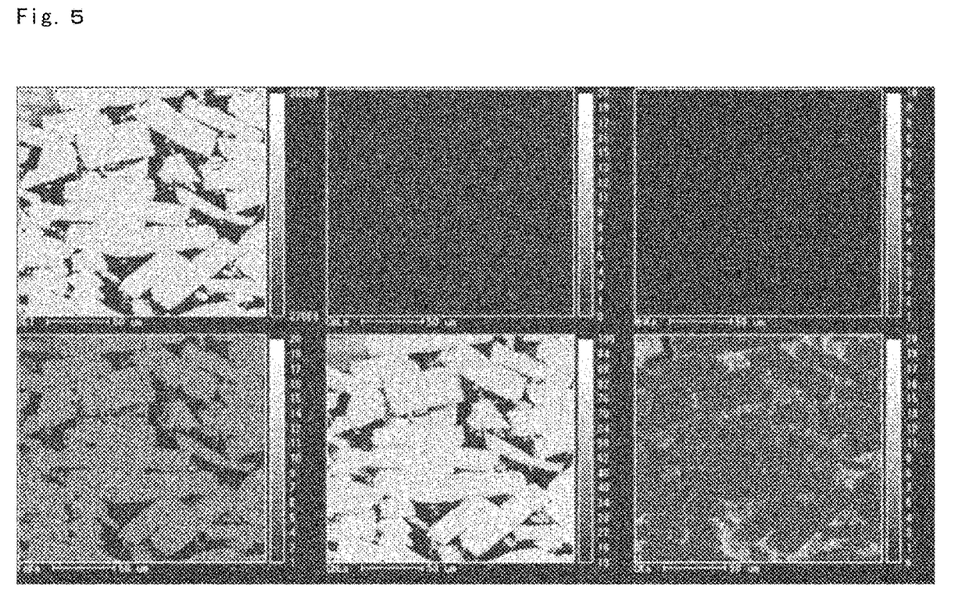
FIG. 5 is a distribution map of constituent elements of the thermoelectric conversion material immediately after start of the sintering process.

FIG. 5 is a distribution map of constituent elements of the same test piece 9 at its cross section. An upper center map shows the distribution of Ce, which shows that Ce is locally mixed. Furthermore, by comparing with an oxygen map on a lower right side, it seems that Ce exposed at the surface slightly includes oxygen solid solution.

Figure 6:
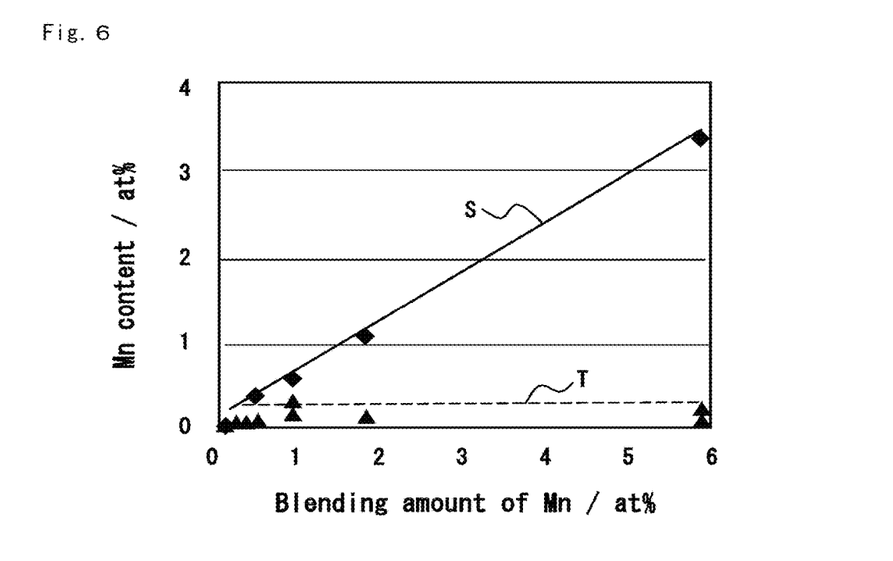
FIG. 6 is a chart showing a correlation between a blending amount of Mn into the material and the entire composition.

FIG. 6 is a view showing an amount of solid solution of Mn, which is one of the constituent elements, into the material, where S is an amount of Mn content in the bulk obtained from results of measurement by ICP (induction coupling plasma) analysis method and T is an amount of Mn content in the main phase obtained from results of measurement by a wavelength dispersion type X-ray analysis method. As described above, Mn can exist only in a small amount in the Fe site of the main phase. For example, since the composition of the main phase is CeMn$_x$Fe$_{4-x}$Sb$_{12}$ (where X=0.02 to 0.1), adding excessive Mn can promote deposition of the sintering aid phase that, works as the sintering aid. As described above, Ce and Sb decrease in larger amounts than the other elements during the manufacturing process. Thus, even if the elements are mixed aiming for CeMn$_x$Fe$_{4-x}$Sb$_{12}$, which is the theoretical value of the skutterudite structure, Mn becomes excessive compared to Ce and Sb, allowing forming of the sintering aid phase. On the other hand, the amount of Mn that can exist in the main phase is small. Thus, too much addition of Mn increases an amount of different phases and decreases the main phase, which is not desirable. For these reasons, it is preferable that the elements are mixed aiming for $CeMn_{0.050-0.125}Fe_{3.950-3.875}Sb_{12}$. For example, in the weighing step, the raw material containing Mn is weighed to be between 0.050 and 0.125 so that the composition ratio of Mn in the main phase is between 0.02 and 0.1 and the excessive Mn that cannot exist in the main phase forms the sintering aid phase. At this time, the composition rate of Mn in the sintering aid phase is equal to the weighed value subtracted by the composition in the main phase, and thus it is considered that a thermoelectric conversion material between 0.03 and 0.105 can be obtained.

As described above, the sintering aid phase (the analysis point C) is seen as shown in FIG. 4, and, in the proximity thereof, there is a part (shown by an arrow) where the crystals of the main phase are directly sintered together (directly joining part). This is a part where the sintering aid phase prompts the crystals to be joined with each other. Consequently, the sintering aid phase is left as a form that is formed discontinuously between the directly joining parts. Thus, it can be considered that the function of the sintering aid phase and formation of the directly joining part contribute to improve density of the sintered body.

Figure 7:
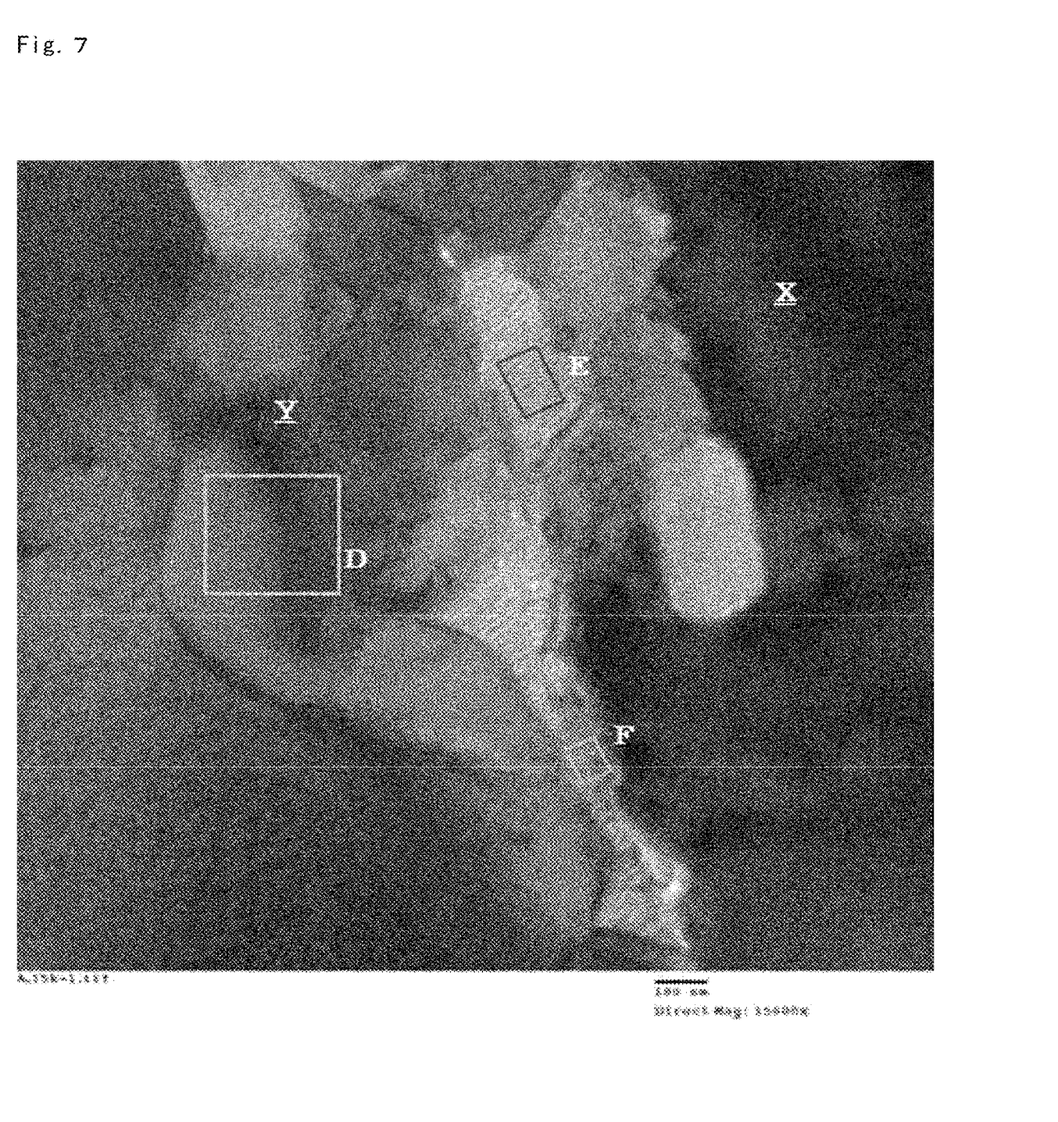
FIG. 7 is a cross sectional TEM image pertaining to a sintering aid phase.

FIG. 7 is a transparent electron microscope image of the sintering aid phase of the test piece 8 shown in FIG. 1. In FIG. 7, X is the main phase and Y is a grain boundary deposition. The grain boundary deposition includes at least Mn, Sb, and O. Furthermore, it shows that the sintering aid phase is formed of at least three phases and is a polycrystalline phase in which the grain boundary is formed between the main phases.

Here, the grain boundary deposition existing in the grain boundary at the time of sintering (see FIG. 2 and FIG. 4) seems to be a liquid phase that is deposited during the thermal processing. It is confirmed, from the results of the composition analysis, that this grain boundary deposition includes oxygen, and it can be considered that Mn, which is likely to be oxidized, and Sb, which is likely to volatile, are the cause for an emergence of the liquid phase. Also, since an existence of such phases is seen in the joining grain boundary of the polycrystalline grains, it is considered that the polycrystalline grains are sintered with each other with the help of these phases. That is, such the phases including Mn, Sb, and O are considered to be working as the sintering aid phase that promotes the sintering process. As shown in Table 3, although compositions of constituents are different from each other, the grain boundary depositions at D, E, and F in FIG. 7 forms the sintering aid phases that include at least three elements of Mn, Sb, and O. The more types of the sintering aid phase there are, the higher the effects in reduction of the thermal conductivity become. However, there are effects in reduction of the thermal conductivity even if there is just one type of the sintering aid phase. Similar results are obtained also from the other test pieces. In Table 3, the amount of Mn in the main phase is too small to be detected by TEM-EDX. However, this can be measured by using a wavelength dispersion type X-ray analysis (SEM-WDX, for example) and its actual measurement result is Mn=0.2 at %.

TABLE 3

| Analyzation Location | | Ce | Mn | Fe | Sb | [at %] O |
|---|---|---|---|---|---|---|
| Main Phase | | 5.4 | — | 15.8 | 73 | 5.8 |
| Grain | D | 30.5 | 17.2 | 0.6 | 31 | 20.7 |
| Boundary | E | — | 35.3 | — | 57.9 | 6.8 |
| Deposition | F | 58.9 | 3.5 | 1.0 | 6.8 | 29.8 |

DESCRIPTION OF NOTATIONS 101, 102, 103, 104 . . . crystal grain
105, 108 . . . grain boundary
106, 107 . . . sintering aid phase
1 . . . thermoelectric conversion material
2 . . . reversed-phase thermoelectric conversion material
3, 3a, 3b . . . conductive material
4 . . . element
5 . . . lower substrate
6 . . . upper substrate
7 . . . wiring
8 . . . wiring

What is claimed is:

1. A thermoelectric conversion material, comprising:
   a sintered body, comprising:
      a main phase including a plurality of crystal grains including Ce, Mn, Fe, and Sb and forming a skutterudite structure;
      a grain boundary between the crystal grains adjacent to each other; and
      a sintering aid phase being formed discontinuously in the grain boundary, wherein
   the sintering aid phase includes at least Mn, Sb, and O,
   a composition formula of the skutterudite structure is $CeMn_xFe_{4-x}Sb_{12}$, and X is within a range of $0.02 \leq X \leq 0.1$.

2. The thermoelectric conversion material according to claim 1, wherein compared to concentrations of Mn, Sb, and O in the main phase,
   concentrations of Mn and O in the sintering aid phase is higher, and
   a concentration of Sb in the sintering aid phase is lower.

3. The thermoelectric conversion material according to claim 1, wherein
   the main phase is formed of a polycrystalline grain.

4. A thermoelectric conversion module, comprising:
   a plurality of elements, each element comprising:
      the thermoelectric conversion material according to claim 1 as a p-type thermoelectric conversion material; and
      a reversed-phase thermoelectric conversion material forming a skutterudite crystalline structure and having a reversed phase to the thermoelectric conversion material as an n-type thermoelectric conversion material, wherein
   the thermoelectric conversion material and the reversed-phase thermoelectric conversion material are connected via a conductive material.

5. The thermoelectric conversion material according to claim 1, wherein the sintering aid phase is generated along a straight or curving line portion of the grain boundary.

* * * * *